(12) United States Patent
Kim et al.

(10) Patent No.: US 9,076,660 B2
(45) Date of Patent: Jul. 7, 2015

(54) POWER MODULE PACKAGE

(71) Applicant: SAMSUNG ELECTRO-MECHANICS CO., LTD., Suwon (KR)

(72) Inventors: Tae Hyun Kim, Suwon (KR); Kwang Soo Kim, Suwon (KR); Sun Woo Yun, Suwon (KR); Young Ki Lee, Suwon (KR); Do Jae Yoo, Suwon (KR)

(73) Assignee: Samsung Electro-Mechanics Co., Ltd., Gyunggi-Do, Korea (KR)

( * ) Notice: Subject to any disclaimer, the term of this patent is extended or adjusted under 35 U.S.C. 154(b) by 0 days.

(21) Appl. No.: 14/103,574

(22) Filed: Dec. 11, 2013

(65) Prior Publication Data

US 2014/0167242 A1  Jun. 19, 2014

(30) Foreign Application Priority Data

Dec. 14, 2012  (KR) .................. 10-2012-0146346

(51) Int. Cl.
| | |
|---|---|
| H01L 23/12 | (2006.01) |
| H01L 23/34 | (2006.01) |
| H01L 23/053 | (2006.01) |
| H01L 23/373 | (2006.01) |

(52) U.S. Cl.
CPC ..... *H01L 23/053* (2013.01); *H01L 2224/32225* (2013.01); *H01L 2224/48137* (2013.01); *H01L 2224/48227* (2013.01); *H01L 2224/48247* (2013.01); *H01L 2224/73265* (2013.01); *H01L 2924/19107* (2013.01); *H01L 23/3735* (2013.01); *H01L 2924/13034* (2013.01); *H01L 2924/13055* (2013.01); *H01L 2924/1305* (2013.01); *H01L 2924/13091* (2013.01)

(58) Field of Classification Search
USPC .................. 257/704, 706, 713, 723, E23.08
See application file for complete search history.

(56) References Cited

U.S. PATENT DOCUMENTS

| | | | | |
|---|---|---|---|---|
| 5,471,089 | A * | 11/1995 | Nagatomo et al. | 257/691 |
| 5,519,252 | A * | 5/1996 | Soyano et al. | 257/690 |
| 5,648,445 | A * | 7/1997 | Slack et al. | 528/49 |
| 5,703,399 | A * | 12/1997 | Majumdar et al. | 257/723 |
| 5,825,536 | A * | 10/1998 | Yasunaga et al. | 359/384 |
| 5,920,119 | A | 7/1999 | Tamba | |
| 6,201,696 | B1 * | 3/2001 | Shimizu et al. | 361/704 |
| 6,272,015 | B1 * | 8/2001 | Mangtani | 361/707 |
| 6,597,063 | B1 * | 7/2003 | Shimizu et al. | 257/687 |
| 7,982,304 | B2 * | 7/2011 | Lu et al. | 257/692 |

* cited by examiner

*Primary Examiner* — Nitin Parekh
(74) *Attorney, Agent, or Firm* — Ladas & Parry, LLP

(57) ABSTRACT

Disclosed herein is a power module package including: a first module configured of a first substrate having one surface and the other surface, a first semiconductor chip mounted on one surface of the first substrate, and a first sealing member formed to cover the first semiconductor chip mounted on one surface of the first substrate from both sides in a thickness direction of the first substrate and expose the other surface of the first substrate; and a case enclosing the first module.

18 Claims, 7 Drawing Sheets

(a)

(b)

POWER MODULE PACKAGE

CROSS REFERENCE TO RELATED APPLICATION

This application claims the benefit of Korean Patent Application No. 10-2012-0146346, filed on Dec. 14, 2012, entitled "Power Module Package", which is hereby incorporated by reference in its entirety into this application.

BACKGROUND OF THE INVENTION

1. Technical Field

The present invention relates to a power module package.

2. Description of the Related Art

Underground resources are limited but energy usage has been increased every year. Therefore, all the countries are directing more attention and effort to the development of alternative energy.

This effort has continued to the development of technologies of implementing high efficiency with less energy. One of the technologies is the very power module.

The power module may be largely classified into an inverter, a converter, and a device for a motor. There are various types of power modules according to the purpose and the usage thereof has been continuously increased.

The industrial and high-capacity power modules with a case according to the related art cannot be mass-produced, are expensive, and cannot be easily accessed.

When the power modules having the case form have a mass-producing structure and a lighter and slimmer structure, the power modules can be used at low costs at more places, which may achieve energy saving, protection of resources, and protection of nature.

To achieve the targets, a power module package structure can resolve the heat generation problem that is the largest vulnerability of the power module and can be mass-produced has first been developed.

Meanwhile, the structure of the power module package according to the prior art is disclosed in U.S. Pat. No. 5,920,119.

SUMMARY OF THE INVENTION

The present invention has been made in an effort to provide a power module package that can be implemented at low cost by being manufactured using an automation process and simplifying a process.

Further, the present invention has been made in an effort to provide a power module package that has improved heat radiating characteristics and can be used at high temperature by minimizing an effect of heat generation of a power unit on a control unit.

In addition, the present invention has been made in an effort to provide a power module package having a structure in which a minimum creepage and clearance between a lead frame and a heat radiating plate of the module is easily secured.

According to a preferred embodiment of the present invention, there is provided a power module package, including: a first module configured of a first substrate having one surface and the other surface, a first semiconductor chip mounted on one surface of the first substrate, and a first sealing member formed to cover the first semiconductor chip mounted on one surface of the first substrate from both sides in a thickness direction of the first substrate and expose the other surface of the first substrate, and a case enclosing the first module.

The first module may further include a first external connection terminal having one end and the other end, the one end being located within the first sealing member so as to be electrically connected with the first semiconductor chip and the other end being protruded to the outside from the first sealing member, wherein the case is provided with an insertion hole into which the other end of the first external connection terminal is inserted.

The first module may include a first surface parallel with one surface of the first substrate, a second surface parallel with both sides in a thickness direction of the first substrate, and a third surface on which the other surface of the first substrate is exposed and the case may cover the first surface and the second surface of the first module and enclose the first module to expose the third surface.

The case may be configured of a first plate covering the first surface of the first module and a second plate covering the second surface of the first module and the first surface of the first module and the first plate may contact each other and the second surface of the first module and the second plate may be spaced apart from each other.

The power module package may further include: a bonding member formed between the first surface of the first module and the first plate.

The power module package may further include: a protective member formed between the second surface of the first module and the second plate.

The case may be configured of a first plate covering the first surface of the first module and a second plate covering the second surface of the first module and may further include a first fastening member fastened so as to penetrate through the first plate and the first module.

The power module package may further include: a heat radiating plate contacting the third surface of the first module, wherein the first fastening member is inserted to a predetermined depth of the heat radiating plate by penetrating through the first plate and the first module.

The case may be configured of a first plate covering the first surface of the first module and a second plate covering the second surface of the first module and may further include a second fastening member inserted to the predetermined depth of the first module by penetrating through the first plate.

The case may be configured of the first plate covering the first surface of the first module and the second plate covering the second surface of the first module and may further include a third fastening member protruded from an inner wall of the first plate contacting the first surface of the first module and fastened to penetrate through the first module.

The third fastening member may have elasticity.

According to another preferred embodiment of the present invention, there is provided a power module package, including: a first module configured of a first substrate having one surface and the other surface, a first semiconductor chip mounted on one surface of the first substrate, and a first sealing member formed to cover the first semiconductor chip mounted on one surface of the first substrate from both sides in a thickness direction of the first substrate and expose the other surface of the first substrate; a second module disposed on the first module and configured of a second substrate having one surface and the other surface and a second semiconductor chip mounted on one surface of the second substrate; and a case enclosing the first module and the second module.

The second module may further include a second sealing member formed to cover a second semiconductor chip mounted on one surface of the second substrate from both sides in a thickness direction of the second substrate and expose the other surface of the second substrate.

The first module may include a first external connection terminal and a first connection terminal each having one end and the other end, the one end being located within the first sealing member so as to be electrically connected with the first semiconductor chip and the other end being protruded from the first sealing member, the second module may include a second external connection terminal and a second connection terminal each having one end and the other end, the one end being located within the second sealing member so as to be electrically connected with the second semiconductor chip and the other end being protruded from the second sealing member, and the case may be provided with a first insertion hole and a second insertion hole into which the first external connection terminal of the first module and the second external connection terminal of the second module are each inserted and is provided with a connection portion electrically connecting the first connection terminal of the first module with the second connection terminal of the second module.

The first module may include a first external connection terminal and a first connection terminal each having one end and the other end, the one end being located within the first sealing member so as to be electrically connected with the first semiconductor chip and the other end being protruded from the first sealing member, the second module may include a second external connection terminal having one end and the other end, the one end being located within the second sealing member so as to be electrically connected with the second semiconductor chip and the other end being protruded from the second sealing member, and the first connection terminal of the first module contacts the other surface of the substrate of the second module to electrically connect the first module with the second module, and the case may be provided with a first insertion hole and a second insertion hole into which the first external connection terminal of the first module and the second external connection terminal of the second module are each inserted.

The second module may further include a second sealing member formed at a position corresponding to the second semiconductor chip on one surface of the second substrate so as to cover the second semiconductor chip.

The first module may include a first external connection terminal and a first connection terminal having one end and the other end, the one end being located within the first sealing member so as to be electrically connected with the first semiconductor chip and the other end being protruded from the first sealing member, the second module may include a second external connection terminal having one end and the other end, the one end contacting one surface of the second substrate so as to be electrically connected with the second semiconductor chip and the other end including a second external connection terminal protruded to the outside, the first connection terminal of the first module may contact the other surface of the second substrate to electrically connect the first module with the second module, and the case may be provided with a first insertion hole and a second insertion hole into which the first external connection terminal of the first module and the second external connection terminal of the second module are each inserted.

The other surface of the second substrate may contact the first module, and the case may further include a fastening member protruded from an inner wall contacting one surface of the second substrate and inserted to a predetermined depth of the first module by penetrating through the second substrate.

The first semiconductor chip may be a power device and the second semiconductor chip may be a control device.

The power module package may further include a bonding member formed between the first module and the second module.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
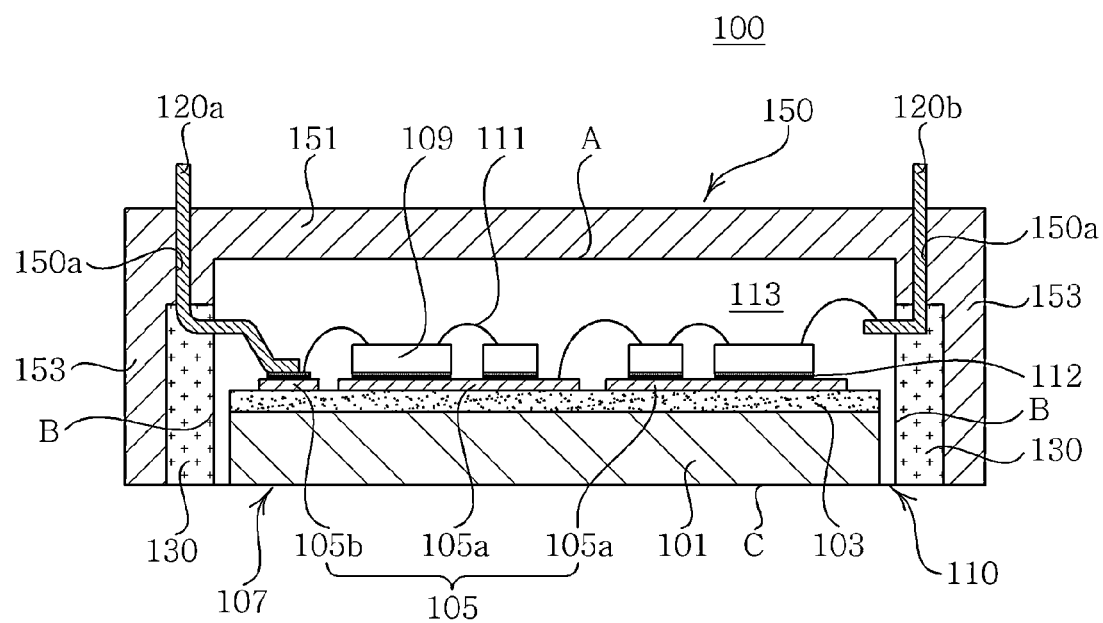
FIG. 1 is a cross-sectional view showing a structure of a power module package according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

First Preferred Embodiment

Figure 2:
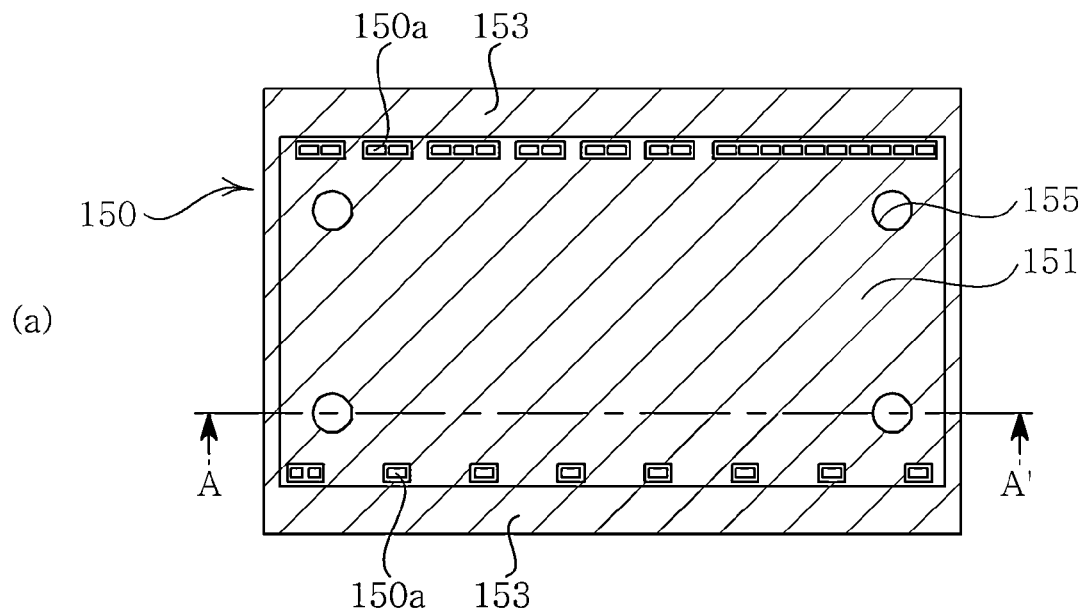
FIG. 2 is a plan view showing a top surface and a bottom surface of the power module package of FIG. 1.
Figure 2:
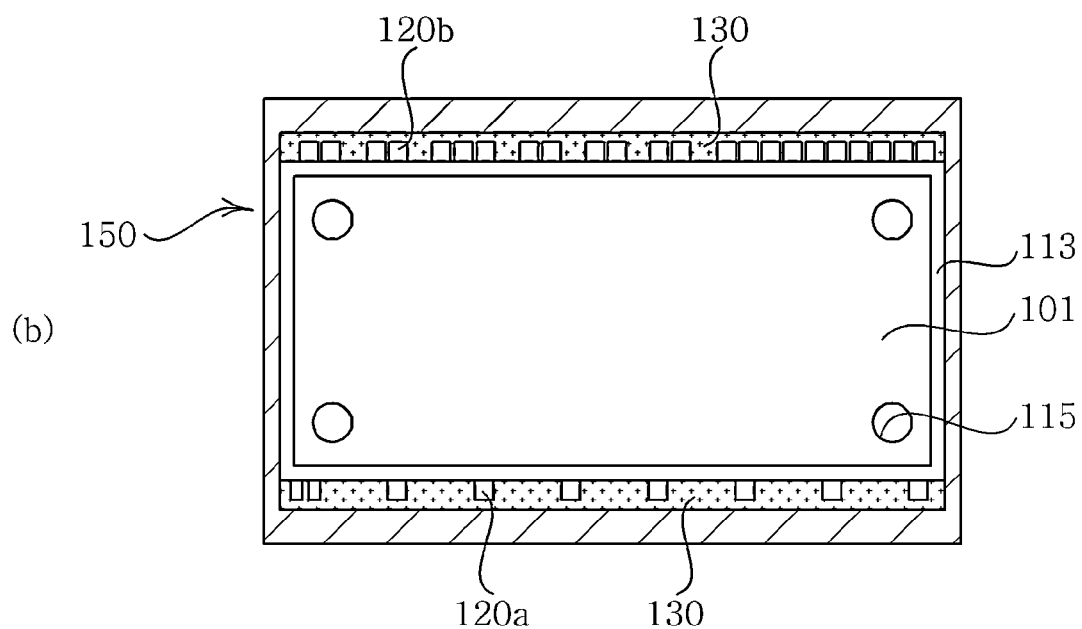
Figure 3:
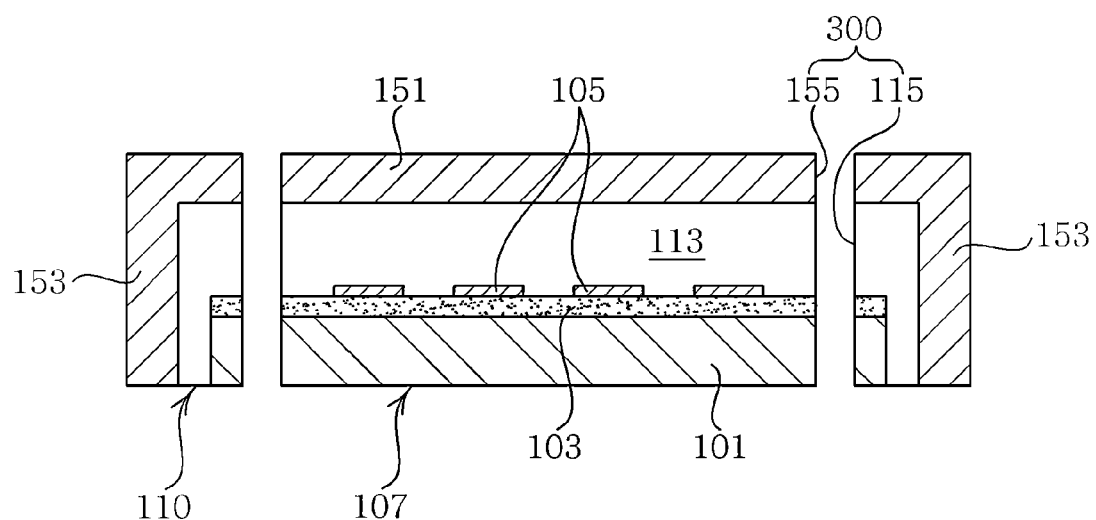
FIGS. 3 and 4 each are a cross-sectional view of the line A-A' of FIG. 2 and cross-sectional views showing a structure with which a first fastening member is fastened.
Figure 4:
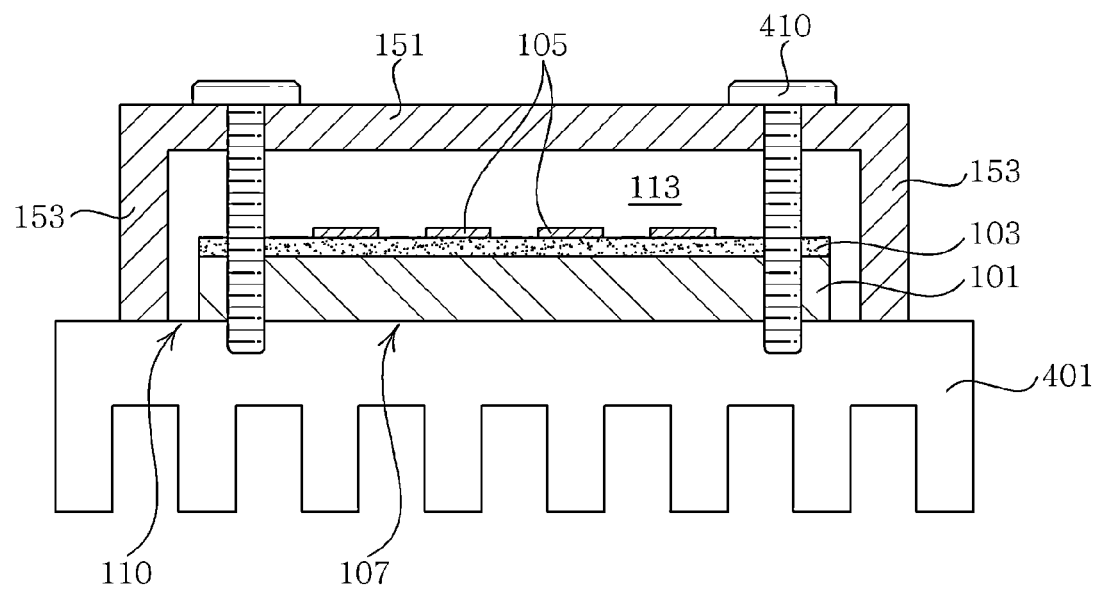
Figure 5:
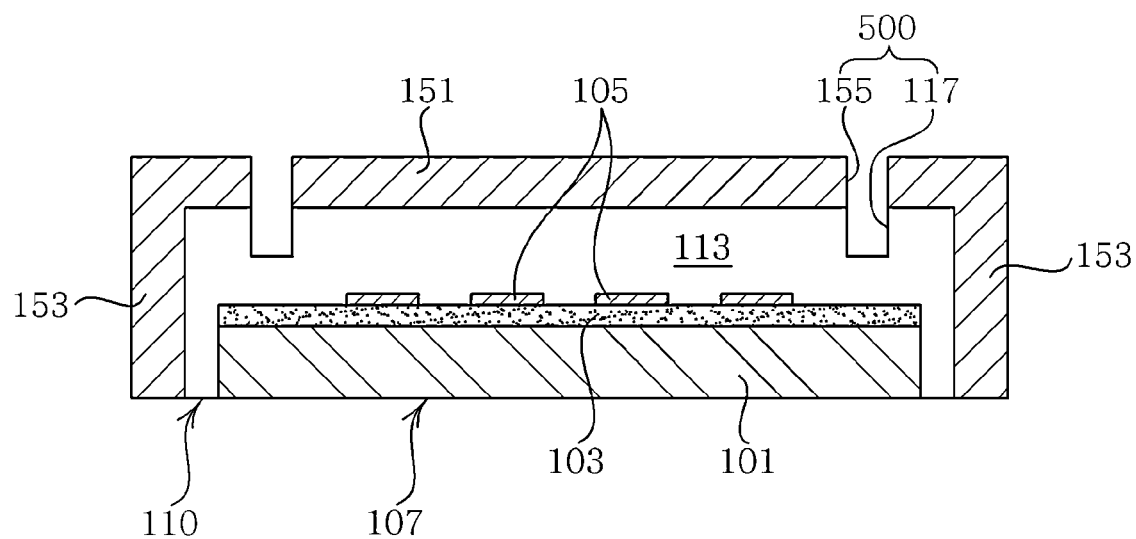
FIGS. 5 and 6 each are a cross-sectional view showing a structure of a fastening groove formed in the power module package of FIG. 1 and a cross-sectional view showing a structure in which a second fastening member is fastened with the fastening groove.
Figure 6:
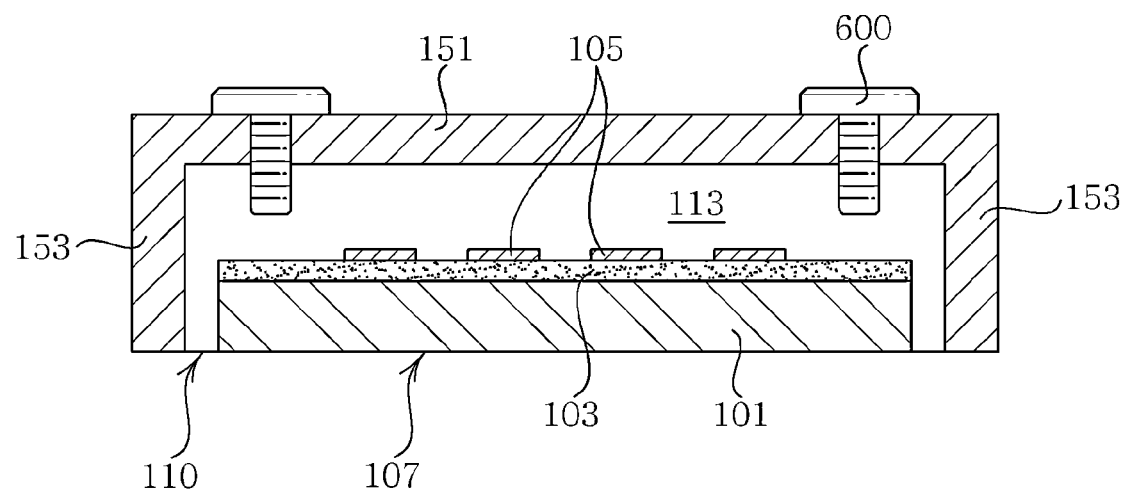
Figure 7:
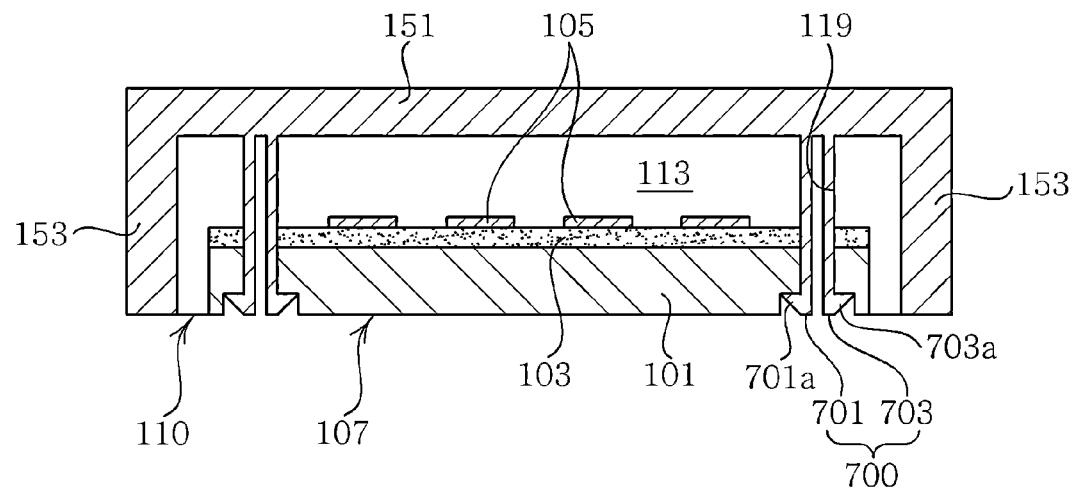
FIGS. 7 and 8 are cross-sectional views of a structure in which a third fastening member protruded from an inner wall of a case of the power module package of FIG. 1 is fastened with the first module.
Figure 8:
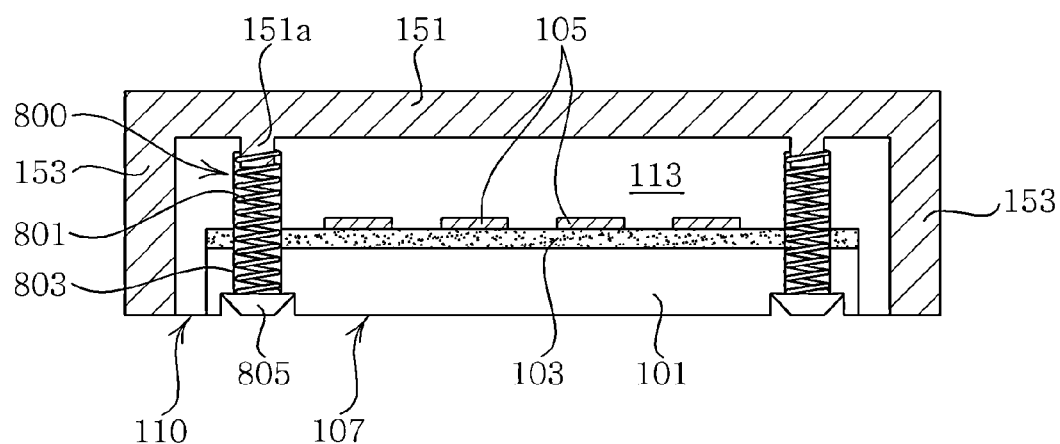

FIG. 1 is a cross-sectional view showing a structure of a power module package according to a first preferred embodiment of the present invention, FIG. 2 is a plan view showing a top surface and a bottom surface of the power module package of FIG. 1, FIGS. 3 and 4 each are a cross-sectional view of the line A-A' of FIG. 2 and cross-sectional views showing a structure with which a first fastening member is fastened, FIGS. 5 and 6 each are a cross-sectional view showing a structure of a fastening groove formed in the power module package of FIG. 1 and a cross-sectional view showing a structure in which a second fastening member is fastened with the fastening groove, and FIGS. 7 and 8 are cross-sectional views of a structure in which a third fastening member protruded from an inner wall of a case of the power module package of FIG. 1 is fastened with the first module.

Referring to FIG. 1, a power module package 100 according to the preferred embodiment of the present invention may include a first module 110 and a case 150 enclosing the first module 110.

According to the preferred embodiment, as shown in FIG. 1, the first module 110 may include a first substrate 107 a first semiconductor chip 109 mounted on one surface of the first substrate 107, and a first sealing member 113 formed to cover the first substrate 107 and the first semiconductor chip 109.

In this configuration, the first substrate 107 may be configured of a metal plate 101, an insulating layer 103 formed on one surface of the metal plate 101, and a circuit pattern 105 formed on the insulating layer 103, but the preferred embodiment of the present invention is not particularly limited. Therefore, an example of the first substrate 107 may include a metal substrate having an anodizing layer, a printed circuit board (PCB), a ceramic substrate, a direct bonded copper (DBC) substrate, and the like.

Here, the metal plate 101 may be formed of a metal material that can easily obtain at relatively low cost and aluminum (Al) or aluminum alloy having high heat conductivity, but the preferred embodiment of the present invention is not particularly limited thereto. Therefore, any metal having high heat conductivity can be used.

In the preferred embodiment of the present invention, the first substrate 107 has one surface and the other surface. In this case, as shown in FIG. 1, one surface may represents a surface on which a first semiconductor chip 109 is mounted, that is, a surface on which the circuit pattern 105 is formed and the other surface may represent a surface opposite the surface, that is, an exposed surface of the metal plate 101.

In addition, according to the preferred embodiment of the present invention, as shown in FIG. 1, the circuit pattern 105 may include a chip mounting pad 105a on which the first semiconductor chip 109 is mounted and an external connection pad 105b contacting first external connection terminals 120a and 120b, but the preferred embodiment of the present invention is not particularly limited thereto.

According to the preferred embodiment of the present invention, the first sealing member 113 may be formed to cover the first semiconductor chip 109 mounted on one surface of the first substrate 107 from both sides in a thickness direction of the first substrate 107 and expose the other surface of the first substrate 107, but the preferred embodiment of the present invention is not particularly limited thereto.

In this case, as the first sealing member 113, epoxy molded compound (EMC), and the like, may be used, but the preferred embodiment of the present invention is not particularly limited thereto.

The first module 110 according to the preferred embodiment of the present invention may include the first external connection terminals 120a and 120b.

Here, the first external connection terminals 120a and 120b each have one end and the other end, wherein one end is located within the first sealing member 113 so as to be electrically connected with the first semiconductor chip 109 and the other end may be protruded to the outside from the first sealing member 113.

In addition, the first external connection terminals 120a and 120b are configured to be electrically connected with an external driving IC or a separate external apparatus for driving the first semiconductor chip 109 mounted on the first substrate 107. As shown in FIG. 1, the first external connection terminals 120a and 102b may be configured of a lead frame, but the preferred embodiment of the present invention is not particularly limited thereto.

In this case, ends of the first external connection terminals 120a and 120b may also be bonded to the external connection pad 105b formed on the substrate 107 so as to be electrically connected with the first semiconductor chip 109 or may be directly connected with an electrode of the first semiconductor chip 109 using a wire 111 so as to be electrically connected with the first semiconductor chip 109.

Further, the first external connection terminal 120a having one end connected to the external connection pad 105b on the substrate 107 among the first external connection terminals 120a and 120b is formed in a down-set form as shown in FIG. 1, but the preferred embodiment of the present invention is not particularly limited thereto. Therefore, the first external connection terminal 120a may be implemented without the down-set.

According to the preferred embodiment of the present invention, the first semiconductor chip 109 may be a power device, wherein the power device may include a silicon controlled rectifier (SCR), a power transistor, an insulated gate bipolar transistor (IGBT), a MOS transistor, a power rectifier, a power regulator, an inverter, a converter, or a high power semiconductor chip or a diode that is a combination thereof.

According to the preferred embodiment of the present invention, a bonding layer 112 may be formed between the first semiconductor chip 109 and the chip mounting pad 105a, wherein the bonding layer 112 may be formed of a solder or a conductive epoxy having a relatively higher heat conductivity so as to effectively radiate heat, but the preferred embodiment of the present invention is not particularly limited thereto.

Further, according to the preferred embodiment of the present invention, the first semiconductor chip 109 and the first substrate 107 and the first external terminals 120a and 120b may be electrically connected with each other via the wire 111, but the preferred embodiment of the present invention is not particularly limited thereto.

In this case, a wire bonding process may be performed by ball bonding, wedge bonding, and stitch bonding that is well-known by those skilled in the art, but the preferred embodiment of the present invention is not particularly limited thereto.

Here, the wire may be formed of aluminum (Al), gold (Au), copper (Cu), and the like, but the preferred embodiment of the present invention is not particularly limited thereto. Generally, the wire that applies a rated voltage of high voltage to the first semiconductor chip 109 that is the power device may be formed of aluminum (Al). The reason is that a thick wire needs to be used so as to endure high voltage and using aluminum (Al) rather than using gold (Au) or copper (Cu) is more effective in terms of cost reduction.

Referring to FIG. 1, the first module 110 according to the preferred embodiment of the present invention may be configured of a first surface A parallel with one surface of the first substrate 107, a second surface B parallel with both sides in a thickness direction of the first substrate 107, and a third surface C to which the other surface of the first substrate 107 is exposed and the case 150 may enclose the first module 110 to cover the first surface A and the second surface B of the first module 110 and to expose the third surface C, but the preferred embodiment of the present invention is not particularly limited thereto.

In addition, the case 150 according to the preferred embodiment of the present invention may be configured of a first plate 151 covering the first surface A of the first module 110 and a second plate 153 covering a second surface B of the first module 110. As shown in FIG. 1, the first surface A of the first module 110 contacts the first plate 151 and the second surface B of the first module 110 may be spaced apart from the second plate 153, but the preferred embodiment of the present invention is not particularly limited thereto.

In this case, a protective member 130 for protecting and insulating the exposed first external connection terminals 120*a* and 120*b* from the outside may be formed between the second surface B of the first module 110 and the second plate 153.

Here, the protective member 130 may be formed of insulating epoxy, and the like, but the preferred embodiment of the present invention is not particularly limited thereto. For example, the protective member 130 may be mounted with a separate case cover (not shown) so as not to expose the first external connection terminals 120*a* and 120*b* to the outside.

In addition, a bonding member (not shown) formed between the first surface A of the first module 110 and the first plate 151 contacting the first surface A may be further provided. Here, the bonding member (not shown) may be formed of insulating epoxy, and the like, but the preferred embodiment of the present invention is not particularly limited thereto.

As such, when the first module 110 is separately manufactured from the case 150 and then, the first module 110 is covered with the case 150, the bonding member (not shown) such as insulating epoxy, and the like, is formed on the contact surface of the first module 110 and the case 150, thereby easily fixing between the first module 110 and the case 150.

In addition, the case 150 of the power module package 100 according to the preferred embodiment of the present invention may be formed with insertion holes 150*a* into which the other ends of the first external connection terminals 120*a* and 120*b* protruded from the first sealing member 113 may be inserted and when the case 150 covers the first module 110, the first external connection terminals 120*a* and 120*b* are each inserted into the corresponding insertion holes 150*a* and the other ends of the inserted first external connection terminals 120*a* and 120*b* may be protruded to the outside from the surface of the case 150.

Meanwhile, the power module package 100 according to the preferred embodiment of the present invention may further include a fastening member for fixing the state in which the case 150 and the first module 110 are joined with each other.

In this case, the fastening member may be implemented in various shapes without being particularly limited. Thereafter, the fastening members according to various preferred embodiments will be described in detail.

First, as the first preferred embodiment of the present invention, referring to FIG. 4, the power module package 100 according to the preferred embodiment of the present invention may include a first fastening member 410 fitted in the first plate 151 and the first module 110 from the surface of the first plate 151 of the case 150.

In this case, as shown in FIG. 3, the first fastening member 410 may be fastened with a fastening hole 310 formed by penetrating through the case 150 and the first module 110.

Here, as shown in FIGS. 2 and 3, the fastening hole 310 may be formed by aligning a first through hole 155 and a second through hole 115 when the case 150 in which a plurality of first through holes 155 are formed on the first plate 151 is joined with the first module 110 in which second through holes 115 are formed at positions corresponding to the first through holes 155, which is only one example. Therefore, the preferred embodiment of the present invention is not particularly limited thereto.

The first fastening member 410 is fastened with the fastening hole 310 formed as above by a screw manner, such that the case 150 and the first module 110 are joined with each other.

In this case, the power module package 100 according to the preferred embodiment of the present invention may further include a heat radiating plate 401 contacting the third surface C of the first module 110, that is, a surface to which the metal plate 101 of the first substrate 107 is exposed.

Here, the heat radiating plate 401 is bonded to the first substrate 107 so as to diffuse heat generated from a first semiconductor chip 109 to the air and may include a plurality of heat radiating pins.

In addition, the heat radiating plate 401 is not particularly limited, but is made of copper (Cu) or tin (Sn) materials or is generally formed by coating the materials, which is to facilitate the bonding with the first substrate 107 while having the excellent heat transfer capability.

As such, when the heat radiating plate 401 is further bonded to the third surface C of the first module 110, as shown in FIG. 4, the first fastening member 410 may be inserted to a predetermined depth of the heat radiating plate 401 by penetrating through the first plate 151 and the first module 110 from the surface of the first plate 151.

In this case, in the heat radiating plate 401, the positions corresponding to the fastening holes 300 on the surface contacting the third surface C of the first module 110 may be formed with grooves (not shown) having a predetermined depth in which the first fastening member 410 may be fastened.

As a second preferred embodiment of the present invention, referring to FIG. 6, the power module package 100 according to the preferred embodiment of the present invention may include a second fastening member 610 inserted to a predetermined depth of the first module 110 by penetrating through the first plate 151 from the surface of the first plate 151 of the case 150.

In this case, the second fastening member 610 may be fastened with the fastening groove 510 formed to a predetermined depth of the first module 110 by penetrating through the case 150 as shown in FIG. 5.

Here, as shown in FIG. 5, the fastening groove 510 may be formed by aligning the first through holes 155 and the insertion grooves 117 when the case 150 in which the plurality of first through holes 155 are formed on the first plate 151 and the first module 110 in which the insertion grooves 117 are formed at the positions corresponding to the first through holes 155 are joined with each other, which is only one example. Therefore, the preferred embodiment of the present invention is not particularly limited thereto.

The fastening groove 510 formed as above is joined with the second fastening member 610 by a screw manner, such that the case 150 and the first module 110 may be joined with each other.

Unlike the first preferred embodiment as described above, the second preferred embodiment describes the example in which the fastening member is inserted to the predetermined depth of the first module rather than penetrating through the first module 110. In this case, the depth in which the fastening member is inserted into the first module 110 is not limited and therefore, the fastening member may be inserted at various depths.

However, a structure shown in FIG. 6, that is, a structure in which the second fastening member 610 penetrates through the case 150 and the second fastening member 610 is inserted to a predetermined depth of the first module 110 may be applied to the case in which the shape of the first module 110 approximates a regular square or a warpage thereof is not large and a structure shown in FIG. 4, that is, a structure in which the first fastening member 410 is fastened with the case 150 and the first module 110 may be applied to the case in which the shape of the first module 110 approximates a rectangle or a warpage thereof is large.

As a third preferred embodiment of the present invention, as shown in FIGS. 7 and 8, a power module package may include third fastening members 700 and 800 having two shapes protruded from the inner wall of the case 150. According to the fastening member having the shape, the third fastening members 700 and 800 of the case 150 are press-fitted in fastening grooves 119 of the first module 110 without forming a separate bonding member for temporarily bonding between the inner wall of the case 150 and the first module 110, thereby simply coupling the case 150 and the first module 110.

As described above, as the process of applying and curing the separate bonding member are not required due to the use of the third fastening members 700 and 800, the overall process time can be shortened and the process cost can also be saved.

As shown in FIG. 7, the third fastening member 700 that is one of the fastening members may be configured to have a form in which two pin-shaped members 701 and 703 are spaced apart from each other at a predetermined distance and the two members 701 and 703 can be elastically moved.

Here, 'elastically' moving means that when pressure is applied inwardly from both sides of the two members 701 and 703 spaced from each other at a predetermined distance, each member 701 and 703 contacts each other as the interval between the members 701 and 703 is reduced and when the pressure applied inwardly is released, each member 701 and 703 may be recovered to an original position by elastic force.

In addition, end portions of each member 701 and 703 (herein, "end portion' means a portion that is opposite to a portion contacting the inner wall of the case 150 in the member) are provided with locking protrusions 701a and 703a, such that a diameter of the end portion of the third fastening member 700 may be formed to be larger than that of other portions.

In addition, a length of the third fastening member 700 may be formed to be the same as a length in a thickness direction of the first module 100, but the preferred embodiment of the present invention is not particularly limited thereto.

However, when the length of the third fastening member 700 is formed to be the same as the length in the thickness direction of the first module 110, the end of the third fastening member 700 is not protruded from the third surface C of the first module 110, as shown in FIG. 4. Therefore, the bonding can be easily performed when the heat radiating plate 401 for heat radiating improvement contacts the third surface C of the first module 110.

Here, the 'same' as described above, does not mean the exactly same dimension in a mathematical meaning, but means substantially the same dimension in consideration of design error, manufacturing error, measurement error, and the like. Hereinafter, the 'same' used in the present specification means substantially the same as described above.

In addition, as shown in FIG. 7, the first module 110 may be provided with the fastening hole 119 with which the foregoing third fastening member 700 is fastened.

In this case, as shown in FIG. 7, the fastening hole 119 is formed by penetrating through in a thickness direction of the first module 110 and may be formed to have a stepped form in which a diameter of a portion 119a corresponding to locking protrusions 701a and 703a of the third fastening member 700 is larger than a diameter of other portions.

Therefore, when the locking protrusions 701a and 703a of the third fastening member 700 are pushed into the fastening hole 119 by applying pressure downwardly from the surface of the first plate 151 of the case 150, the third fastening member 700 is press-fitted in an inlet of the fastening hole 119 by applying pressure toward the inner sides of two members 701 and 703.

Thereafter, when the locking protrusions 701a and 703a finally reach a portion 119a in which the diameter of the fastening hole 119 is large by continuously applying pressure downwardly so that the locking protrusions 701a and 703a of the third fastening member 700 reach the portion 119a having a large diameter in the fastening hole 119, each member 701 and 703 is recovered to an original position by releasing the pressure applied to the two members 701 and 703 of the third fastening member 700 and is locked to a stepped portion, such that the first module 110 may be joined with the case 150.

In addition, as shown in FIG. 8, the third fastening member 800 may be configured of a protruded portion 151a protruded from the inner wall of the first plate 151 of the case 150, an elastic member 801 having one end joined with the protruded portion 151a and the other end, and a body portion 803 enclosing a locking portion 805 joined with the other end of the elastic member 801 and the elastic member 801 and integrally formed with the locking portion 805.

In this case, the fastening hole 119 fastened with the third fastening member 800 may be formed by penetrating through the first module 110 in the thickness direction and may have a stepped form in which a diameter of the portion 119a corresponding to the locking portion 805 of the third fastening member 800 in the fastening hole 119 is larger than that of the other portions.

Therefore, when disposing the locking portion 805 of the third fastening member 800 at the inlet of the fastening hole 119 and then, applying pressure downwardly from the surface of the first plate 151 of the case 150, the third fastening member 800 is completely inserted into the fastening hole 119 by press-fitting the locking portion 805 in the inlet of the fastening hole 119 and when the third fastening member is pushed to the end of the fastening hole, the locking portion 805 is locked to the stepped portion, such that the first module 110 may be joined with the case 150.

Here, a spring, and the like, may be used as the elastic member 801, but the present invention is not particularly limited thereto.

As such, the locking portion 805 is pulled in the direction of the case 150 by the elastic force of the elastic member 801 by connecting the inner wall of the case 150 with the locking portion 805 using the elastic member 801, such that the first module 110 and the case 150 may be more tightly fastened with each other.

Second Preferred Embodiment

Figure 9:
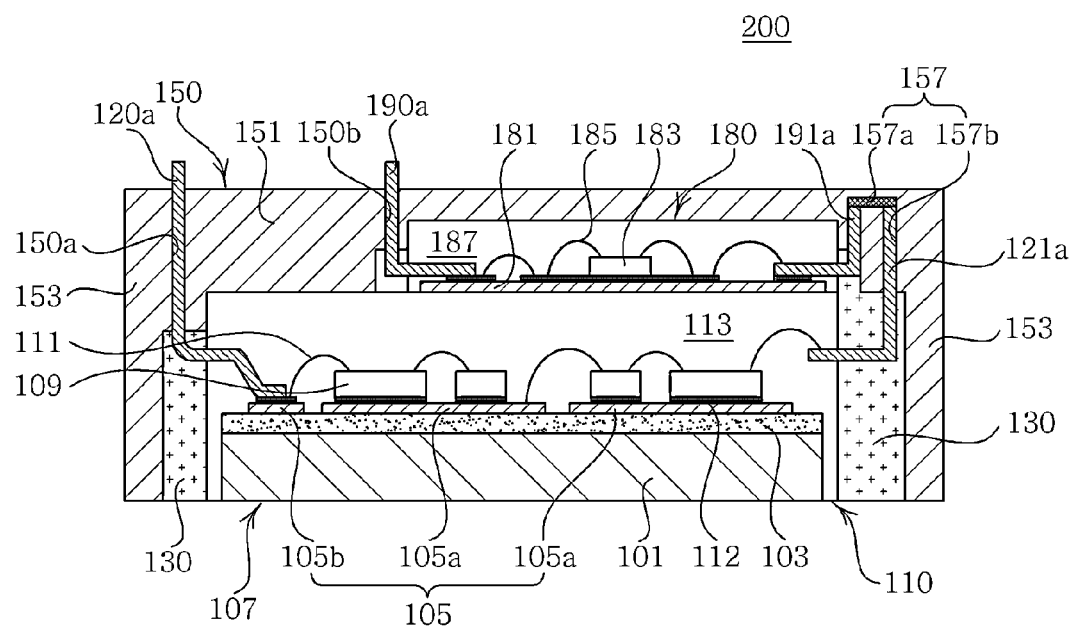
FIG. 9 is a cross-sectional view showing a structure of a power module package according to a second preferred embodiment of the present invention.

FIG. 9 is a cross-sectional view showing a structure of a power module package according to a second preferred embodiment of the present invention.

The description of overlapping components with the foregoing first preferred embodiment of the present invention will be omitted in the second preferred embodiment of the present invention. Further, the overlapping components with the first preferred embodiment of the present invention are denoted by the same reference numerals.

Referring to FIG. 9, a power module package 200 according to the preferred embodiment of the present invention may include the first module 110, the second module 180 disposed on the first module 110, and the case 150 enclosing the first module 110 and the second module.

Further, the power module package may further include a bonding member (not shown) formed between the first module 110 and the second module 180.

The first module 110 according to the preferred embodiment of the present invention may include the first external connection terminal 120a and the first connection terminal 121a.

Here, the first external connection terminals 120a and the first connection terminal 121a each have one end and the other end, wherein one end is located within the first sealing member 113 so as to be electrically connected with the first semiconductor chip 109 and the other end may be protruded from the first sealing member 113.

In this case, the first external connection terminal 120a may act to electrically connect the first module 110 with a separate external apparatus (not shown) and the first connection terminal 121a may act to electrically connect the first module 110 with the second module 180 disposed on the first module 110, but the preferred embodiment of the present invention is not limited thereto.

In the preferred embodiment of the present invention, the second module 180 may include a second substrate 181 having one surface and the other surface, a second semiconductor chip 183 mounted on one surface of the second substrate 181, and a second sealing member 187 formed to cover the second semiconductor chip 183 mounted on one surface of the second substrate 181 from both sides in a thickness direction of the second substrate 181 and expose the other surface of the second substrate 181.

Here, the second substrate 181 may be a printed circuit board (PCB), but the preferred embodiment of the present invention is not particularly limited thereto.

Further, the second semiconductor chip 183 may be a control element for controlling a driving of a power element.

Further, the second module 180 may include a second external connection terminal 190a and a second connection terminal 191a.

Here, the second external connection terminal 190a and the second connection terminal 191a each have one end and the other end, wherein one end is located within the second sealing member 187 so as to be electrically connected with the second semiconductor chip 183 and the other end may be protruded from the second sealing member 187.

In this case, the second external connection terminal 190a may act to electrically connect the second module 180 with a separate external apparatus (not shown) and the second connection terminal 191a may act to electrically connect the second module 180 with the first module 110, but the preferred embodiment of the present invention is not limited thereto.

The case 150 according to the preferred embodiment of the present invention may be provided with a first insertion hole 150a and a second insertion hole 150b into which the other end of the first external connection terminal 120a of the first module 110 and the other end of the second external connection terminal 190a of the second module 180 are each inserted.

In addition, the case 150 according to the preferred embodiment of the present invention may be provided with a connection portion 157 for electrically connecting the first connection terminal 121a of the first module 110 with the second connection terminal 191a of the second module 180 and the connection portion 157 may be configured of a plurality of grooves 157b into which the first connection terminal 121a and the second connection terminal 191a are each inserted and a conductive member 157a connected with ends of each groove 157b as shown in FIG. 9. However, the preferred embodiment of the present invention is not particularly limited thereto.

Here, the conductive member 157a may be made of metal, but the preferred embodiment of the present invention is not limited thereto. Therefore, any material having conductivity can be used.

Therefore, the first connection terminal 121a and the second connection terminal 191a inserted into each groove 157b may be electrically connected with each other via the conductive member 157a. Therefore, the first module 110 and the second module 180 may be electrically connected with each other.

Meanwhile, although not shown in the drawings, the power module package 200 according to the preferred embodiment of the present invention may also be applied with the fastening member according to various embodiments that are applied to the power module package 100 according to the first embodiment of the present invention.

Third Preferred Embodiment

Figure 10:
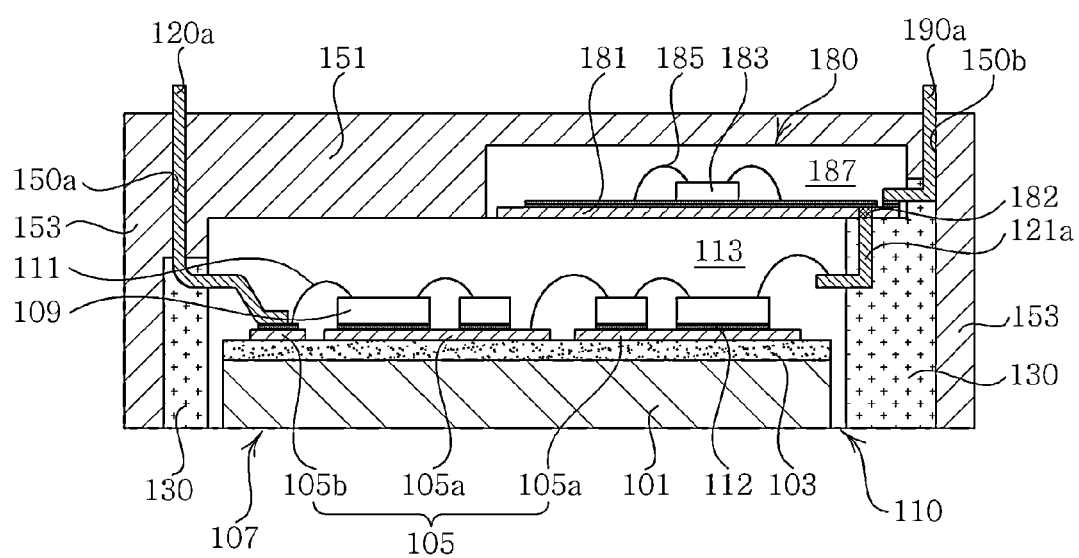
FIG. 10 is a cross-sectional view showing a structure of a power module package according to a third preferred embodiment of the present invention.

FIG. 10 is a cross-sectional view showing a structure of a power module package according to a third preferred embodiment of the present invention.

The description of overlapping components with the foregoing second preferred embodiment of the present invention will be omitted in the third preferred embodiment of the present invention. Further, the overlapping components with the second preferred embodiment of the present invention are denoted by the same reference numerals.

Referring to FIG. 10, a power module package 300 according to the preferred embodiment of the present invention may include the first module 110, the second module 180 disposed on the first module 110, and the case 150 enclosing the first module 110 and the second module 180.

Further, the power module package 300 may further include a bonding member (not shown) formed between the first module 110 and the second module 180.

The first module 110 according to the preferred embodiment of the present invention may include the first external connection terminal 120a and the first connection terminal 121a.

Here, the first external connection terminal 120a and the first connection terminal 121a each have one end and the other end, wherein one end is located within the first sealing member 113 so as to be electrically connected with the first semiconductor chip 109 and the other end may be protruded from the first sealing member 113.

In this case, the first external connection terminal 120a may act to electrically connect the first module 110 with a separate external apparatus (not shown) and the first connection terminal 121a may act to electrically connect the first module 110 with the second module 180 disposed on the first module 110, but the preferred embodiment of the present invention is not particularly limited thereto.

In the preferred embodiment of the present invention, the second module 180 may include the second substrate 181 having one surface and the other surface, the second semiconductor chip 183 mounted on one surface of the second substrate 181, and the second sealing member 187 formed to cover the second semiconductor chip 183 mounted on one surface of the second substrate 181 from both sides in a thickness direction of the second substrate 181 and expose the other surface of the second substrate 181.

Further, the second module 180 may include the second external connection terminal 190a.

Here, the second external connection terminal 190a has one end and the other end, wherein one end is located within the second sealing member 187 so as to be electrically connected with the second semiconductor chip 183 and the other end may be protruded from the second sealing member 187.

In this case, the second external connection terminal 190a may act to electrically connect the second module 180 with a separate external apparatus (not shown), but the preferred embodiment of the present invention is not particularly limited thereto.

In the preferred embodiment of the present invention, the second module 180 does not include the separate connection terminal as in the foregoing second preferred embodiment of the present invention but the first connection terminal 121a of the first module 110 may contact the other surface of the second substrate 181 of the second module 180 to electrically connect the first module 110 with the second module 180.

In this case, the portion in which the other end of the first connection terminal 121a of the first module 110 contacts the second substrate 181 of the second module 180 may be formed with a via 182 for electrically connecting a circuit pattern (not shown) formed on one surface of the second module 180 with the first connection terminal 121a of the first module 110, but the preferred embodiment of the present invention is not particularly limited thereto.

For example, the second substrate 181 is formed with a hole (not shown) into which the other end of the first connection terminal 121a may be inserted and the first module 110 may be electrically connected with the second module 180 by inserting the other end of the first connection terminal 121a into the first hole (not shown).

The case 150 according to the preferred embodiment of the present invention may be provided with the first insertion hole 150a and the second insertion hole 150b into which the other end of the first external connection terminal 120a of the first module 110 and the other end of the second external connection terminal 190a of the second module 180 are each inserted.

Fourth Preferred Embodiment

Figure 11:
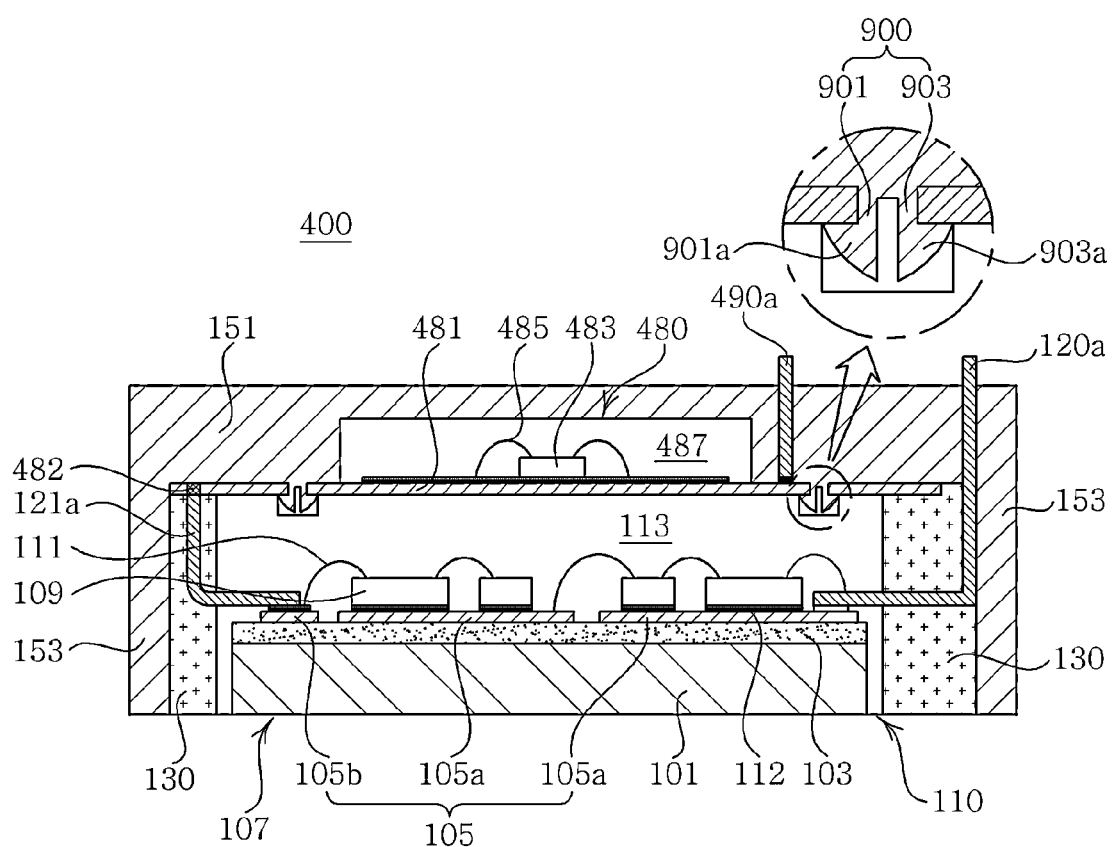
FIG. 11 is a cross-sectional view showing a structure of a power module package according to a fourth embodiment of the present invention.

FIG. 11 is a cross-sectional view showing a structure of a power module package according to a fourth preferred embodiment of the present invention.

The description of overlapping components with the foregoing second preferred embodiment of the present invention will be omitted in the fourth preferred embodiment of the present invention. Further, the overlapping components with the second preferred embodiment of the present invention are denoted by the same reference numerals.

Referring to FIG. 11, a power module package 400 according to the preferred embodiment of the present invention may include the first module 110, a second module 480 disposed on the first module 110, and the case 150 enclosing the first module 110 and the second module 480.

Further, the power module package 400 may further include a bonding member (not shown) formed between the first module 110 and the second module 480.

The first module 110 according to the preferred embodiment of the present invention may include the first external connection terminal 120a and the first connection terminal 121a.

Here, the first external connection terminal 120a and the first connection terminal 121a each have one end and the other end, wherein one end is located within the first sealing member 113 so as to be electrically connected with the first semiconductor chip 109 and the other end may be protruded from the first sealing member 113.

In this case, the first external connection terminal 120a may act to electrically connect the first module 110 with a separate external apparatus (not shown) and the first connection terminal 121a may act to electrically connect the first module 110 with the second module 480 disposed on the first module 110, but the preferred embodiment of the present invention is not particularly limited thereto.

In addition, in the fourth preferred embodiment of the present invention, the second module 480 may include a second substrate 481 having one surface and the other surface, a second semiconductor chip 483 mounted on one surface of the second substrate 481, and a second sealing member 487 formed to enclose a portion in which the second semiconductor chip 483 is mounted on one surface of the second substrate 481 and to expose a portion in which the second semiconductor chip 483 is not mounted.

Further, in the preferred embodiment of the present invention, the second module 480 may include a second external connection terminal 490a.

Here, the second external connection terminal 490a has one end and the other end, wherein one end contacts one surface of the second substrate 481 on which the second sealing member 487 is exposed without being formed so as to be electrically connected with the second semiconductor chip 483 and the other end may be protruded to the outside.

In the preferred embodiment of the present invention, the second external connection terminal 490a can be freely disposed, as compared with the second external connection terminal 190a according to the foregoing second preferred embodiment and third preferred embodiment of the present invention.

In the preferred embodiment of the present invention, the second module 480 does not include the separate connection terminal as in the foregoing second preferred embodiment of the present invention but the first connection terminal 121a of the first module 110 contacts the other surface of the second substrate 481 of the second module 480 to electrically connect the first module 110 with the second module 480.

In this case, the portion in which the first connection terminal 121a of the first module 110 contacts the second substrate 481 of the second module 480 may be formed with a via 482 for electrically connecting a circuit pattern (not shown) formed on one surface of the second module 480 with the first connection terminal 121a of the first module 110, but the preferred embodiment of the present invention is not particularly limited thereto.

For example, the second substrate 481 is formed with a hole (not shown) into which the other end of the first connection terminal 121a may be inserted and the first module 110 may be electrically connected with the second module 480 by inserting the other end of the first connection terminal 121a into the hole (not shown).

The case 150 according to the preferred embodiment of the present invention may be provided with the first insertion hole 150a and the second insertion hole 150b into which the other end of the first external connection terminal 120a of the first module 110 and the other end of the second external connection terminal 490a of the second module 480 are each inserted.

Further, in the preferred embodiment of the present invention, as shown in FIG. 11, the case 150 may further include a fastening member 900 that is protruded from the inner wall contacting one surface of the second substrate 481 and is inserted to the predetermined depth of the first module 110 by penetrating through the second substrate 481.

In addition, in the present preferred embodiment of the present invention, the portion in which the fastening member 900 is fastened with the second substrate 481 may be formed with a fastening hole 481a and the portion in which the fastening member 900 is fastened with the first module 110 may be formed with a fastening groove 417.

Here, a diameter of the fastening groove 417 may be formed to be larger than that of the fastening hole 481a, but the preferred embodiment of the present invention is not particularly limited thereto.

Further, as shown in FIG. 11, the fastening member 900 may have a form in which two members 901 and 903 are spaced apart from each other at a predetermined interval and the two members 901 and 903 may be elastically moved and ends of the two members 901 and 903 may be formed with locking protrusions 901a and 903a.

In this case, an operation mechanism of the fastening member 900 may be the same as that of the first one of the third fastening members 700 according to the first preferred embodiment of the present invention.

That is, when the locking protrusions 901a and 903a of the fastening member 900 are pushed into the inlet of the fastening hole 481a by applying pressure downwardly from the surface of the first plate 151 of the case 150, the fastening member 900 is press-fitted in the fastening hole 481a and the fastening groove 417 by applying pressure toward the inner sides of two members 901 and 903.

In this case, when the locking protrusions 901a and 903a reach the fastening groove 417, the locking protrusions 901a and 903a are locked to the second substrate 481 by releasing the pressure applied to the two members 901 and 903, such that the first module 110 and the second module 480 may be joined with the case 150.

The power module package according to the preferred embodiments of the present invention is manufactured by separately manufacturing the first module from the case and then covering the first module with the case to easily join and fix the first module and the case and implement the automation process, thereby simplifying the process and shortening the process time.

In addition, according to the power module package of the preferred embodiments of present invention, the module is molded at inexpensive liquid resin and then, joined with the case, thereby saving the process costs.

Further, according to the power module package of the preferred embodiment of the present invention, the fastening member is formed in the inner wall of the case and press-fitted in the fastening hole of the first module, thereby joining and fixing the first module and the case without the bonding member for temporarily bonding between the first module and the case.

Also, according to the power module package of the preferred embodiment of the present invention, the power unit and the control unit are separately molded to minimize the effect of heat generated from the power unit on the control unit and improve the temperature characteristic, such that the power module package can be used at high temperature.

Moreover, the power module package according to the preferred embodiments of the present invention is manufactured by joining the molded module with the case, thereby easily securing the minimum creepage and clearance between the lead frame and the heat radiating plate of the module.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package, comprising:
   a first module configured of a first substrate having one surface and another surface, a first semiconductor chip mounted on the one surface of the first substrate, and a first sealing member formed to cover the first semiconductor chip mounted on the one surface of the first substrate from both sides in a thickness direction of the first substrate and expose the other surface of the first substrate, the first module including a first surface parallel with one surface of the first substrate, a second surface parallel with both sides in a thickness direction of the first substrate, and a third surface on which the other surface of the first substrate is exposed; and
   a case enclosing the first module and configured of a first plate covering the first surface of the first module and a second plate covering the second surface of the first module; and
   a bonding member formed between the first surface of the first module and the first plate.

2. The power module package as set forth in claim 1, wherein the first module further includes a first external connection terminal having one end and the other end, the one end being located within the first sealing member so as to be electrically connected with the first semiconductor chip and the other end being protruded to the outside from the first sealing member, and
   the case is provided with an insertion hole into which the other end of the first external connection terminal is inserted.

3. The power module package as set forth in claim 1, wherein
   the case covers the first surface and the second surface of the first module and encloses the first module to expose the third surface.

4. The power module package as set forth in claim 3, wherein
   the first surface of the first module and the first plate contact each other and the second surface of the first module and the second plate are spaced apart from each other.

5. The power module package as set forth in claim 4, further comprising:
   a protective member formed between the second surface of the first module and the second plate.

6. The power module package as set forth in claim 3, wherein the case is configured of a first plate covering the first surface of the first module and a second plate covering the second surface of the first module, and further includes first fastening member fastened so as to penetrate through the first plate and the first module.

7. The power module package as set forth in claim 6, further comprising:
a heat radiating plate contacting the third surface of the first module,
wherein the first fastening member is inserted to a predetermined depth of the heat radiating plate by penetrating through the first plate and the first module.

8. The power module package as set forth in claim 3, wherein the case is configured of a first plate covering the first surface of the first module and a second plate covering the second surface of the first module, and
further includes a second fastening member inserted to the predetermined depth of the first module by penetrating through the first plate.

9. The power module package as set forth in claim 3, wherein the case is configured of the first plate covering the first surface of the first module and the second plate covering the second surface of the first module, and
further includes a third fastening member protruded from an inner wall of the first plate contacting the first surface of the first module and fastened to penetrate through the first module.

10. The power module package as set forth in claim 9, wherein the third fastening member has elasticity.

11. The power module package of claim 1, further comprising:
a second module disposed on the first module and configured of a second substrate having one surface and the other surface and a second semiconductor chip mounted on one surface of the second substrate; and
wherein the case encloses the first module and the second module.

12. The power module package as set forth in claim 11, wherein the second module further includes a second sealing member formed to cover a second semiconductor chip mounted on one surface of the second substrate from both sides in a thickness direction of the second substrate and expose the other surface of the second substrate.

13. The power module package as set forth in claim 12, wherein the first module includes a first external connection terminal and a first connection terminal each having one end and the other end, the one end being located within the first sealing member so as to be electrically connected with the first semiconductor chip and the other end being protruded from the first sealing member,
the second module includes a second external connection terminal and a second connection terminal each having one end and the other end, the one end being located within the second sealing member so as to be electrically connected with the second semiconductor chip and the other end being protruded from the second sealing member, and
the case is provided with a first insertion hole and a second insertion hole into which the first external connection terminal of the first module and the second external connection terminal of the second module are each inserted and is provided with a connection portion electrically connecting the first connection terminal of the first module with the second connection terminal of the second module.

14. The power module package as set forth in claim 12, wherein the first module includes a first external connection terminal and a first connection terminal each having one end and the other end, the one end being located within the first sealing member so as to be electrically connected with the first semiconductor chip and the other end being protruded from the first sealing member,
the second module includes a second external connection terminal having one end and the other end, the one end being located within the second sealing member so as to be electrically connected with the second semiconductor chip and the other end being protruded from the second sealing member,
the first connection terminal of the first module contacts the other surface of the substrate of the second module to electrically connect the first module with the second module, and
the case is provided with a first insertion hole and a second insertion hole into which the first external connection terminal of the first module and the second external connection terminal of the second module are each inserted.

15. The power module package as set forth in claim 11, wherein the second module further includes a second sealing member formed at a position corresponding to the second semiconductor chip on one surface of the second substrate so as to cover the second semiconductor chip.

16. The power module package as set forth in claim 15, wherein the first module includes a first external connection terminal and a first connection terminal having one end and the other end, the one end being located within the first sealing member so as to be electrically connected with the first semiconductor chip and the other end being protruded from the first sealing member,
the second module includes a second external connection terminal having one end and the other end, the one end contacting one surface of the second substrate so as to be electrically connected with the second semiconductor chip and the other end including a second external connection terminal protruded to the outside,
the first connection terminal of the first module contacts the other surface of the second substrate to electrically connect the first module with the second module, and
the case is provided with a first insertion hole and a second insertion hole into which the first external connection terminal of the first module and the second external connection terminal of the second module are each inserted.

17. The power module package as set forth in claim 15, wherein the other surface of the second substrate contacts the first module, and
the case further includes a fastening member protruded from an inner wall contacting one surface of the second substrate and inserted to a predetermined depth of the first module by penetrating through the second substrate.

18. The power module package as set forth in claim 11, wherein the first semiconductor chip is a power device and the second semiconductor chip is a control device.

* * * * *